United States Patent [19]

Reuschel et al.

[11] 4,027,051
[45] May 31, 1977

[54] METHOD OF PRODUCING HOMOGENEOUSLY DOPED N-TYPE SI MONOCRYSTALS AND ADJUSTING DOPANT CONCENTRATION THEREIN BY THERMAL NEUTRON RADIATION

[75] Inventors: Konrad Reuschel, Vaterstetten; Manfred Schnoeller, Haimhausen; Alfred Muehlbauer, Sauerlach; Eberhard Spenke, Pretzfeld; Wolfgang Keller, Munich, all of Germany

[73] Assignee: Siemens Aktiengesellschaft, Berlin & Munich, Germany

[22] Filed: Dec. 6, 1974

[21] Appl. No.: 530,347

[30] Foreign Application Priority Data

Dec. 14, 1973 Germany ............................ 2362264

[52] U.S. Cl. .................................. 427/35; 148/1.5; 357/63; 357/91
[51] Int. Cl.$^2$ .......................................... B05D 3/06
[58] Field of Search .......................... 357/29, 91, 63; 148/1.5; 427/35

[56] References Cited

UNITED STATES PATENTS 3,076,732  2/1963  Tanenbaum ........................ 148/1.5

OTHER PUBLICATIONS

Tanenbaum et al., "J. Electrochemical Soc." vol. 108, No. 2, Feb. 1961, pp. 171–176.

*Primary Examiner*—John H. Newsome
*Attorney, Agent, or Firm*—Hill, Gross, Simpson, Van Santen, Steadman, Chiara & Simpson

[57] ABSTRACT

Homogeneously doped Si monocrystals of the n-type are produced from p- or n-type Si crystals having a random dopant concentration in radial and axial directions of the crystal and the dopant concentration within such crystals is adjusted by subjecting such crystals to controlled thermal neutron radiation.

1 Claim, 3 Drawing Figures

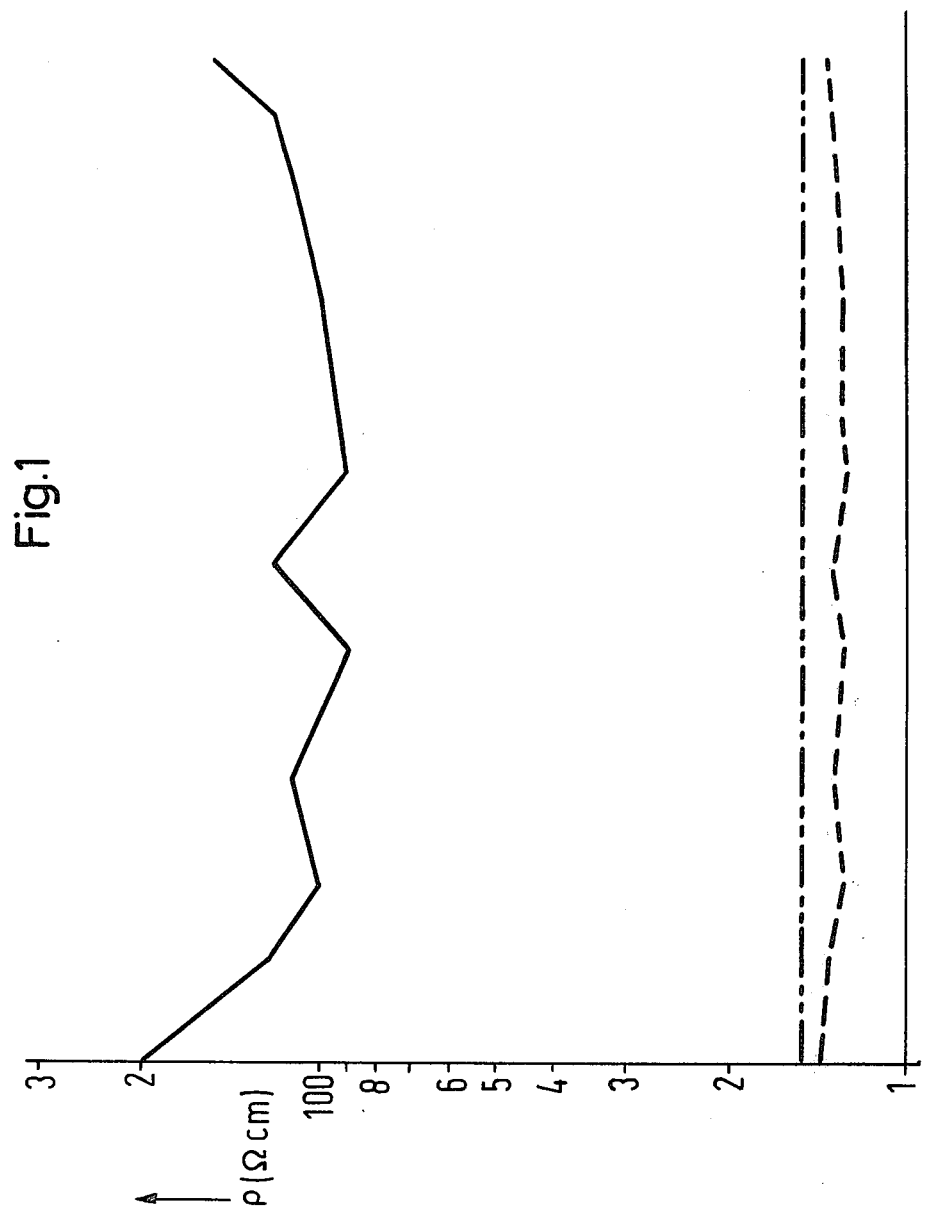

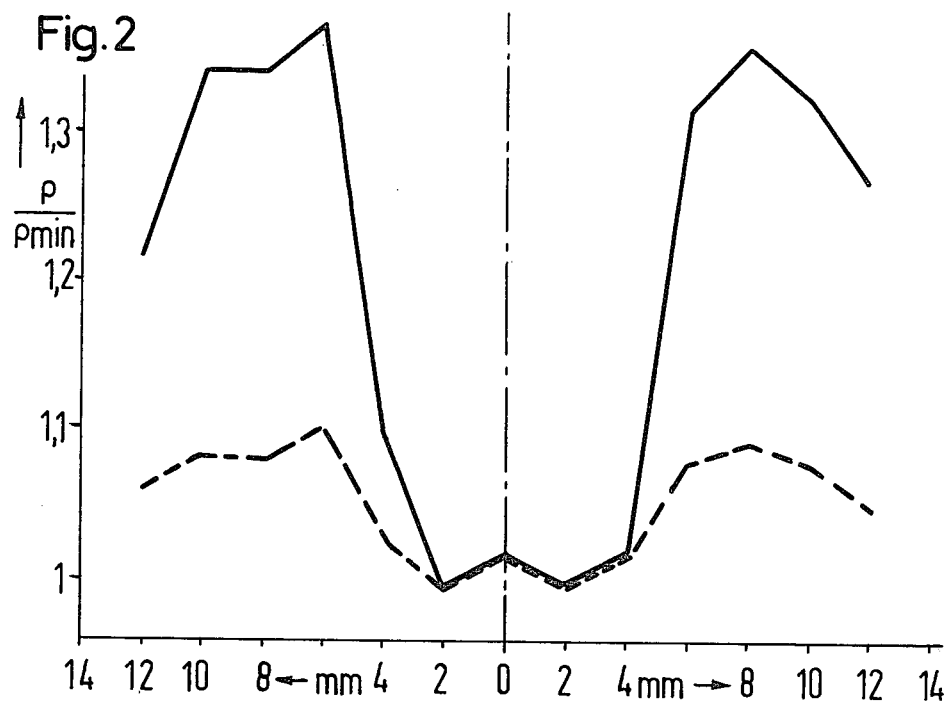
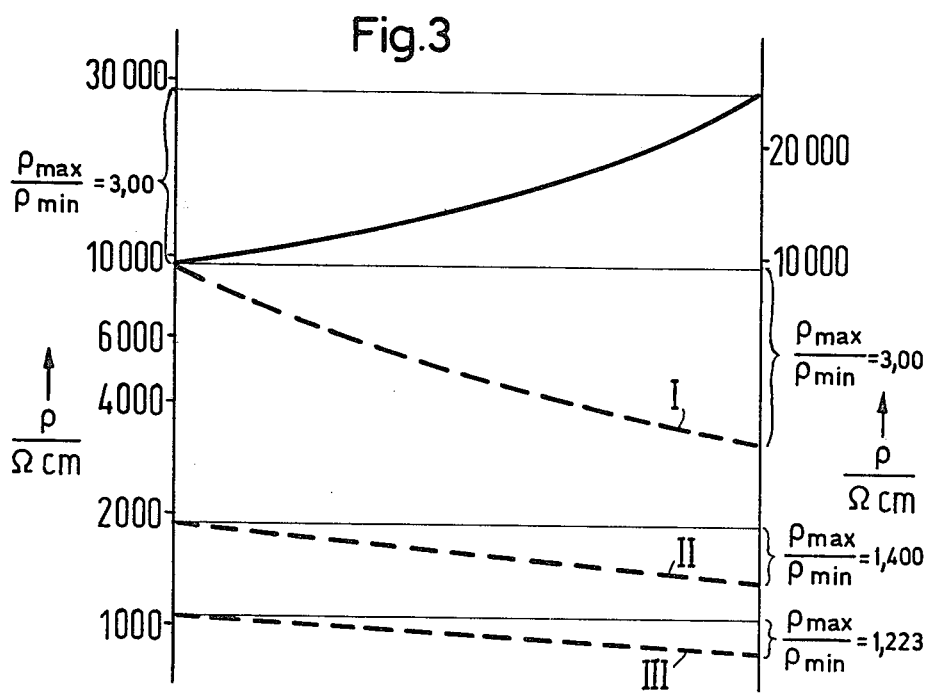

METHOD OF PRODUCING HOMOGENEOUSLY DOPED N-TYPE SI MONOCRYSTALS AND ADJUSTING DOPANT CONCENTRATION THEREIN BY THERMAL NEUTRON RADIATION

BACKGROUND OF THE INVENTION

1. Field of the Invention

The invention relates to a method of producing homogeneously doped n-type Si monocrystals and adjusting dopant concentration within such crystals and somewhat more particularly to a method of producing such crystals and adjusting dopant concentrations therein by controllably irradiating p- or n-type Si monocrystals having a random dopant concentration in radial and axial directions thereof with thermal neutrons in accordance with the reaction:

$$Si^{30} (n, \gamma) Si^{31} \xrightarrow{\beta^-} P^{31}. \qquad (I)$$

2. Prior Art

Si crystal bodies, such as rods, are generally doped after the precipitation or deposition of solid Si onto a heated mandrel or rod-shaped carrier member with the aid of thermal and/or pyrolytic decomposition of gaseous Si compounds. In such a process, dopants are intermixed with a gaseous Si compound and decompose at the carrier member so as to be dispersed within the forming Si body. The Si rods or bodies so produced are polycrystalline and must be converted into a monocrystalline state by subsequent zone melting processes. During such zone melting, the concentration of the dopant within the Si rod often changes in an uncontrolled manner and considerably higher dopant concentrations must be provided in the polycrystalline rods in order to attain a desired dopant concentration in the final crystalline rods, especially in instances where a plurality of zone melting processes are utilized. The silicon crystal rods of the n-type produced in this manner exhibit radial and axial fluctuations in specific resistance at micro areas of the crystal. Such fluctuations can be traced back to the fluctuation of dopant concentration therein which is primarily imparted during the crystal growth process. Fluctuations in specific resistance cause considerable drawbacks, particularly in the production of highly blocking semiconductor components.

M. Tanenbaum et al, "Preparation of Uniform Resistivity n-Type Silicon by Nuclear Transmutation", Journal of Electrochemical Society, Vol. 108, No. 2, Pages 171–176 (February 1961), suggests that Si crystals having n-type conductivity may be produced by radiation of thermal neutrons on pure Si crystals. In this process, the natural isotope $Si^{30}$, which is present in pure Si crystals, is transmuted into the unstable isotope $Si^{31}$ by the capture of a thermal neutron and emission of $\gamma$ radiation. The unstable $Si^{31}$ isotope decays by $\beta^-$ emission with a 2.62 Hr. half-life into the stable $P^{31}$ isotope.

From the foregoing, a so-called radiogeneous doping of silicon may be achieved in accordance with the nuclear reaction:

$$Si^{30} (n, \gamma) Si^{31} \xrightarrow{\beta^-} P^{31} \qquad (I)$$

so that by presuming that the entire amount of $Si^{31}$ is completely decayed and that the transmutation loss of $Si^{30}$ is negligibly small, the following simple computation is valid:

$$C_P = 1.7 \times 10^{-4} \times \Phi \times t \qquad (II)$$

wherein $C_P$ is the phosphorous concentration in atoms/cm$^3$; $\Phi$ is the thermal neutron flux in neutrons/cm$^2$ × sec; and $t$ is the radiation time in seconds.

SUMMARY OF THE INVENTION

The invention provides a method of producing homogeneously and uniformly doped Si monocrystals of the n-conductivity type having an adjustable dopant concentration along a plane thereof, whereby dopant concentration fluctuations in radial and axial directions of the crystals are substantially eliminated or completely eliminated.

In accordance with the principles of the invention, the hereinabove described radiogeneous doping of Si is utilized to produce a homogeneous and fluctuation-free dopant concentration in a Si crystal whereby a Si crystal is controllably exposed to neutron radiation in accordance with a desired dopant concentration in such crystal so that an amount of produced or created P atoms within the irradiated Si crystal is greater by at least a factor of 2 than would correspond to a dopant concentration in the Si crystals prior to exposure to thermal neutrons if a p-conductivity material was used.

The method of the invention comprises the production of homogeneously doped and dopant concentration fluctuation-free Si monocrystals of the n-conductivity type by exposing a Si monocrystal of a select conductivity type to radiation by thermal neutrons in accordance with the equation:

$$Si^{30} (n, \gamma) Si^{31} \xrightarrow{\beta^-} P^{31} \qquad (I)$$

whereby a pre-doped p- or n-conductivity type Si crystal having a precisely determined total concentration of a dopant therein throughout the mass of the crystal but which dopant concentration randomly fluctuates in radial and axial directions thereof is exposed to neutron radiation in accordance with a desired n-dopant concentration and sufficient to produce an amount of P atoms within the irradiated Si material which is greater by at least a factor of 2 than the precisely determined total concentrations of dopant in the original material (prior to neutron radiation). The specific electrical resistivity of the pre-doped monocrystal is carefully and accurately measured and a computation made of the dopant concentration therein so that an exact axial and radial dopant concentration profile (which corresponds to the axial and radial specific resistivity profile) is attained so that the amount of P atoms required for the desired conductivity is readily determined. Then, by utilizing the derived values in the equation:

$$\frac{C_1}{C_2} = \frac{C_3 + C_x}{C_4 + C_x} \qquad (III)$$

wherein $C_1$ is the maximum dopant concentration within a crystal after doping;

$C_2$ is the minimum dopant concentration within the crystal after doping;

$C_3$ is the maximum dopant concentration within the crystal prior to doping;

$C_4$ is the minimum dopant concentration within the crystal prior to doping; and $C_x$ is the amount of dopant addition via radiogeneous doping in accordance with equation (I); a suitable radiation time is determined via equation (II) and the Si crystal is subjected to radiation by thermal neutrons via a suitable core reactor and the desired conductivity is attained within the treated crystals.

BRIEF DESCRIPTION OF THE DRAWINGS

FIG. 1 is a graphical illustration showing on a logarithmic scale the measured resistivity distribution ($\rho$ value) in the axial direction of a Si monocrystal, first prior to neutron radiation (solid line) and then after radiation (broken line);

FIG. 2 is a graphical illustration showing the relation of measured resistivity distribution in an untreated rod (solid line) and the identical rod after being subjected to neutron radiation in accordance with the principles of the invention (broken line); and FIG. 3 is a graphical illustration showing the comparison of measured resistivity distributions along a rod axis in an untreated rod (solid line) and in an identical rod which has been subjected to various degrees of neutron radiation in accordance with the principles of the invention.

DESCRIPTION OF THE PREFERRED EMBODIMENTS

The invention provides a method of producing homogeneously and uniformly doped Si monocrystals of the n-conductivity type or having an adjustable dopant concentration along a plane thereof which eliminates or substantially eliminates dopant fluctuations in radial and axial directions of the monocrystals.

The invention utilizes equations (I) and (II) above, and provides dopant concentration fluctuation-free Si monocrystals by subjecting a pre-doped Si monocrystal of a select conductivity type (p- or n-type) to an exact determination of its specific resistivity and then placing the monocrystal within a controlled source of thermal neutron radiation so that the monocrystal is exposed to neutron radiation and the neutrons (which have an energy level such that approximately one $P^{31}$ atom is created per 6000 thermal neutrons per square centimeter per second) create or produce P atoms therein to an extent greater than at least by a factor of 2 than the previously determined total dopant concentration in the original material.

The principles of the invention may also be stated by the equation:

$$C_{PZ} > 2 C_{A-D} \qquad (IV)$$

wherein $C_{PZ}$ is the concentration of phosphorous atoms in the crystal after radiation; and $C_{A-D}$ is the dopant concentration (acceptors-doners) in the original material prior to radiation.

When an n-conductive type original material is used in the practice of the invention, a decrease of the dopant concentration fluctuation occurs when the desired n-doping material concentration is adjusted by neutron radiation. Generally, the dopant concentration fluctuations may be readily understood from the relation:

$$\frac{C_1}{C_2} = \frac{C_3 + C_x}{C_4 + C_x} \qquad (III)$$

wherein $C_1$ is the maximum dopant concentration in a rod after radiation;

$C_2$ is the minimum dopant concentration in a rod after radiation;

$C_3$ is the maximum dopant concentration in a rod prior to radiation;

$C_4$ is the minimum dopant concentration in a rod prior to radiation; and $C_x$ is the amount of dopant added via the radiogeneous dopant reaction (I).

The dopant concentration profile (which corresponds to the axial and radial specific resistivity profile) in axial and radial directions of a Si crystal rod produced in accordance with the principles of the invention is thus formed from the total of the electrically effective carrier concentration (donors-acceptors) in the original rod and the added phosphorous concentration attained via neutron radiation.

In order to achieve a decrease of the dopant concentration fluctuations and thus attain a balancing of the resistivity variations during the controlled positive doping in accordance with the invention, it is necessary to exactly measure the p- or n-level of the original or starting crystal rod.

In an exemplary embodiment produced in accordance with the principles of the invention, the amount of phosphorous which is created within the silicon rod is adjusted so as to be larger by one decimal power over the originally measured electrically effective donor concentration in the starting crystal rod. In accordance with this, a dopant concentration fluctuation of $$\frac{\rho_{max.}}{\rho_{min.}} = 2.22$$

in a starting crystal rod, for example, may be decreased to 1.09.

FIG. 1 illustrates, on a logarithmic scale, the measured resistivity distribution ($\rho$ value) along an axial plane of a rod, initially prior to neutron radiation (solid line) and then after neutron radiation (dash-dash line). As shown, the continuous or solid line curve has fluctuations ranging from about 200 ohm × cm to about 90 ohm × cm for an untreated rod, while the dash-dash curve, which illustrates an exemplary embodiment of the invention, has a substantially straight line resistivity distribution with fluctuations ranging from only about 12.8 ohm × cm to about 14.0 ohm × cm for the identical (solid line curve) but irradiated rod. In this embodiment, a resistivity value of 13.5 ohm × cm was desired.

The dash-double dot-dash curve shows the results attained by producing additional amounts of phosphorous atoms within the Si crystal, which were precalculated to yield a specific resistivity of 15 ohm × cm. Computations show that a resistivity of 15 ohm × cm is equal to $3.3 \times 10^{14}$ atoms/cm$^3$ so that when a homogeneous neutron flux of $8 \times 10^{13}$ neutrons/cm$^2$ × sec is used, the radiation time ($t$) is calculated from equation (I) as follows:

$$t = \frac{3.3 \times 10^{14}}{(1.7 \times 10^{-4})(8 \times 10^{13})} = 2.42 \times 10^4 \text{ sec.} = 6 \text{ hr. } 44 \text{ min.}$$

FIG. 2 shows another exemplary embodiment of the invention wherein a decrease of dopant concentration fluctuations (i.e., $\rho$ fluctuations) is shown in the radial direction of a rod having an axis 12; the solid line curve shows the fluctuations before radiation and the dash-dash curve shows the fluctuations after radiation. In this exemplary embodiment, a n-conductive silicon rod having a diameter of 30 mm and a length of 22 cm was cut off at both ends thereof and the two cut surfaces were carefully examined by means of a four-probe measuring device having a protective head to determine the radial path of resistivity thereof. From the results so-obtained, the continuous or solid line curve was produced. In FIG. 2, the rod diameter is shown along the abscissa and the ratio $\rho/\rho$ min. is shown along the ordinate. The dash-dot line 12 illustrates the center of the rod (or disc center).

In an exemplary embodiment of the invention, it was desired to decrease the resistivity profile from 320 ohm × cm to about 63 ohm × cm, i.e., by a factor of 5. A decrease of the $\rho$ fluctuations along the radial direction was achieved, as shown by the curve ranging from 420/304 to 65/59 ($\rho$ max./$\rho$ min.), i.e., by a factor of 2.5 The dash-dash curve illustrates the measured resistivity distribution of the radiated material. In this exemplary embodiment wherein a $\rho$ min. goal of about 60 ohm × cm, which corresponds to about $8.5 \times 10^{13}$ atoms/cm$^3$ was desired, an additional doping of about $6.75 \times 10^{13}$ atoms/cm$^3$ had to be provided by neutron radiation, after the donor concentration in the original starting material was determined as $1.75 \times 10^{13}$ atoms/cm$^3$ prior to radiation.

In another embodiment of the invention (which is useful with p-conductivity type original materials), the amount of phosphorous atoms created by neutron radiation is regulated so that initially a compensation occurs for the p-dopant therein and then the desired n-dopant concentration is added by correspondingly increased neutron radiation. In this embodiment, a p-type Si monocrystal, for example, having a specific resistivity of $\rho \sim 1400$ ohm × cm (corresponding to a $C_A$ value of about $9.5 \times 10^{12}$ acceptor atoms/cm$^3$) may comprise the starting material and it is desired to achieve a n-Si crystal having a $\rho$ value of 180 ohm × cm (corresponding to a $C_P$ value of about $2.9 \times 10^{13}$ phosphorous atoms/cm$^3$). In accordance with the principles of the invention, an amount of phosphorous atoms is created or added via neutron radiation in the p-Si crystal so that the phosphorous concentration after radiation, $C_{PZ}$, is equal to $(2.9 + 0.95) \times 10^{13} = 3.85 \times 10^{13}$ phosphorous atoms/cm$^3$. When a homogeneous neutron flux of $8 \times 10^{13}$ neutrons/cm$^2$ × sec is used, $8.16 \times 10^{11}$ phosphorous atoms/cm$^3$ are created per minute. The radiation time ($t$) required to provide $3.85 \times 10^{13}$ phosphorous atoms/cm$^3$ with the foregoing flux is:

$$t = \frac{3.85 \times 10^{13}}{8.16 \times 10^{11}} = 47 \text{ min.}$$

In general, the following relations apply:

$$\frac{\Delta \rho_n}{\rho_n} = \frac{\mu_n}{\mu_p} \times \frac{\rho_n}{\rho_p} \times \frac{\Delta \rho_p}{\rho_p} \times \frac{\mu_n}{\mu_p} = 3$$

A small $\Delta \rho$ n/$\rho$ p, which indicates a uniform or substantially uniform n-doping, is best achieved by either using p-doped materials which are not excessively varied (i.e. $\Delta \rho$ p/$\rho$ p <<1) and seek $\rho$ n values which are 3 or more factors below the original $\rho$ p value, i.e. ($\rho$ n/$\rho$ p <1/3); or by selecting starting materials having a $\rho$ p value which is at least 3 times greater than the sought or target $\rho$ n value.

It may be desirable to increase the $\rho$ p value of an original crystal rod as much as possible by a large number of zone pullings, as during a floating melt zone process. However, this process entails some drawbacks. The acceptor atoms in a p-type Si crystal generally are boron atoms, which have a distribution coefficient k = 0.9 ≈1. It has been known for some time that when a k-value is so close to 1, the purification effect of zone pulling is very low. Therefore, a substantial increase of the $\rho$ p value cannot be expected. However, it is known, for example, see W. G. Pfann "Zone Melting", 1958, that after even a few zone pullings, an initially uniform $\rho$ p distribution becomes rather steep. For example, $\Delta \rho$ p/$\rho$ p after only 5 pullings becomes:

$$\frac{\rho_{p\ max.} - \rho_{p\ min.}}{\rho_p} = \frac{1/0.73 - 1/1.27}{1} \approx 1.370 - 0.787 = 0.583$$

This value must be multiplied by the mobility ratio $\rho$ n/$\rho$ p = 3 and thus brings the $\Delta \rho$ n/$\rho$ n value to the magnitude of 1.8.

When one seeks to decrease the resistivity value of a Si crystal rod by one order of magnitude, one must compute $\rho$ n/$\rho$ p = 1/10. This means that the rod would not only have to be converted from p-conductivity to n-conductivity, but would also have to be massively over-compensated to decrease the absolute resistivity value by one order of magnitude.

FIG. 3 shows a comparison of resistivity values between an original Si crystal rod prior to neutron radiation and the same rod after it has been subjected to three different levels of neutron radiation. The solid line curve illustrates the $\rho$-value of the original rod and shows that at one end thereof (the seed crystal end), the $\rho$-value is close to 30,000 ohm × cm and at the other end close to 10,000 ohm × cm. The broken-line curve I shows the $\rho$-value of the same rod after $1.9 \times 10^{12}$ phosphorous atoms/cm$^3$ have been produced within the original rod by neutron radiation. The broken-line curve II shows the $\rho$-value of the same rod after $4 \times 10^{12}$ phosphorous atoms/cm$^3$ have been produced by neutron radiation and the curve III shows the $\rho$-value after $6.6 \times 10^{12}$ phosphorous atoms/cm$^3$ have been produced or created within the original rod via neutron radiation. The concentration of electrically effective phosphorous atoms creating the n-line results from the difference $C_D - C_A$. Plotting this value results in the curves shown. As can be seen from the curves I, II and III, the homogeneity of n-doping is greatly improved when the relation $\rho$ max./$\rho$ min. is less than 3 and when the relation $C_{PZ} > 2\ C_{A-D}$ is maintained.

The production of a thermal neutron flow is known in the art and suitable core reactors of the light water-moderated type or the graphite-moderated type may be utilized as a radiation source. Similarly, measurements of the specific resistivity of Si crystals is well known and a detailed description of the procedure and instrumentation therefor is accordingly not required.

It is thought that the invention and its advantages will be understood from the foregoing description and it is apparent that various changes may be made in the process, form, construction and arrangements of the various features of the invention without departing from the scope of the invention or sacrificing its mate-

We claim as our invention:

1. A method of producing homogeneously doped silicon monocrystals having n-conductivity, comprising:

providing a silicon monocrystal having a precisely determined total concentration of a dopant therein throughout the mass of said monocrystal but wherein the concentration of dopant randomly fluctuates along the length and width of such monocrystal; and subjecting said monocrystal to controlled thermal neutron irradiation, said thermal neutrons having an average energy level such that approximately one $P^{31}$ atom is created per 6000 thermal neutrons per square centimeter per second, and so that the reaction:

$$Si^{30}(n,\gamma)Si^{31} \rightarrow P^{31}$$

occurs within said monocrystal to such an extent that the amount of so-produced phosphorus atoms within such monocrystal is at least a factor of two times larger than the precisely determined total concentration of dopant in the silicon monocrystal prior to neutron irradiation.

* * * * *